US012771330B2

(12) United States Patent
Rosik et al.

(10) Patent No.: US 12,771,330 B2
(45) Date of Patent: Oct. 20, 2026

(54) SERIAL INTERFACE BUS WITH GLITCH FILTERING

(71) Applicant: QUALCOMM Incorporated, San Diego, CA (US)

(72) Inventors: Raymond Rosik, San Diego, CA (US); Zdravko Lukic, San Diego, CA (US); Huiqiao He, Singapore (SG); Christopher Thompson, La Jolla, CA (US); Chris Rosolowski, Encinitas, CA (US); John Fletcher, Encinitas, CA (US); Edgar Marti-Arbona, Chandler, AZ (US)

(73) Assignee: Qualcomm Incorporated, San Diego, CA (US)

( * ) Notice: Subject to any disclaimer, the term of this patent is extended or adjusted under 35 U.S.C. 154(b) by 58 days.

(21) Appl. No.: 18/739,820

(22) Filed: Jun. 11, 2024

(65) Prior Publication Data

US 2025/0379566 A1 Dec. 11, 2025

(51) Int. Cl.
*H03K 5/1252* (2006.01)
*H03K 5/133* (2014.01)

(52) U.S. Cl.
CPC .......... *H03K 5/1252* (2013.01); *H03K 5/133* (2013.01)

(58) Field of Classification Search
CPC ...... H03K 5/1252; H03K 5/133; H03K 5/125; H03K 5/14; H03K 19/00346; H03K 17/16; H03K 17/162; G06F 11/07; G06F 11/0703; G06F 11/0706; G06F 11/0751
See application file for complete search history.

(56) References Cited

U.S. PATENT DOCUMENTS 6,778,111 B1 * 8/2004 Zhu ........................ H04L 25/08 341/134
2003/0091135 A1 5/2003 Bonafos et al.
2004/0015774 A1 1/2004 Sakai et al.
2021/0119621 A1 4/2021 Bal et al.

OTHER PUBLICATIONS

International Search Report and Written Opinion—PCT/US2025/023873—ISA/EPO—Aug. 5, 2025.

* cited by examiner

*Primary Examiner* — Jung Kim
(74) *Attorney, Agent, or Firm* — Harrity & Harrity, LLP

(57) ABSTRACT

A glitch filter associated with a serial interface bus may receive an input signal associated with a glitch. The glitch filter may reject the glitch based at least in part on a plurality of state machine transitions associated with the glitch filter and a set of timers associated with the glitch filter, to produce an output signal that is not associated with the glitch. The glitch filter may provide the output signal. In some aspects, the set of timers includes a high timer and a low timer, and the input signal is locked at a high state for at least a length of the high timer and locked at a low state for at least a length of the low timer, in accordance with the plurality of state machine transitions. The glitch filter may be implemented as an asynchronous finite state machine (AFSM) filter or a synchronous finite state machine.

20 Claims, 12 Drawing Sheets

100

400

SERIAL INTERFACE BUS WITH GLITCH FILTERING

FIELD OF THE DISCLOSURE

Aspects of the present disclosure generally relate to integrated circuits and, for example, to serial interface buses with glitch filtering.

BACKGROUND

A power management integrated circuit (PMIC) is a type of integrated circuit used for power management. A PMIC may be a solid state device that controls a flow and a direction of electrical power. A PMIC may perform functions related to power management, which may include direct current (DC)-to-DC conversion, battery charging, power source selection, and/or voltage scaling. A PMIC may have a serial interface bus or multiple serial interface buses with pads.

SUMMARY

In some implementations, a device includes a glitch filter configured to: receive an input signal associated with a glitch; reject the glitch based at least in part on a plurality of state machine transitions associated with the glitch filter and a set of timers associated with the glitch filter; and provide an output signal.

In some implementations, a method includes receiving, by a glitch filter associated with a serial interface bus, an input signal associated with a glitch; rejecting, by the glitch filter, the glitch based at least in part on a plurality of state machine transitions associated with the glitch filter and a set of timers associated with the glitch filter, to produce an output signal that is not associated with the glitch; and providing, by the glitch filter, the output signal.

In some implementations, a serial interface buffer, comprising: one or more components configured to: receive an input signal associated with a glitch; reject the glitch based at least in part on a plurality of state machine transitions and a set of timers to produce an output signal that is not associated with the glitch; and provide an output signal.

Aspects generally include a method, apparatus, system, computer program product, non-transitory computer-readable medium, user device, user equipment, wireless communication device, and/or processing system as substantially described with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
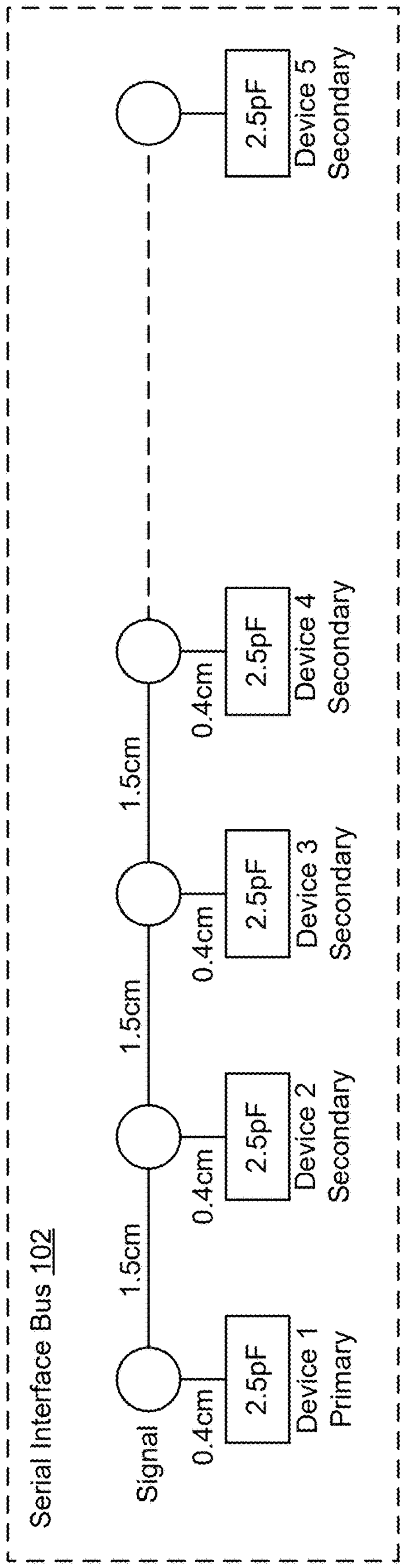
FIG. 1 is a diagram illustrating an example associated with a system chipset serial interface bus, in accordance with the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

A chipset may include a serial interface bus for communication between different devices. In a large system, the serial interface bus may be relatively long (e.g., up to 50 cm or more) between devices, and multiple devices may be included along the serial interface bus. A higher clock frequency (e.g., a frequency of up to 38.4 MHZ) may be used to accommodate higher traffic on the serial interface bus. The higher clock frequency may require a tighter delay budget and faster rise/fall times for signals, such as clock signals and/or data signals. The serial interface bus may be routed across the chipset with transmission lines on a printed circuit board (PCB). A transmission line may be a pulsed transmission line, in which pulses of signals may be sent on the transmission line. The pulses may include a clock pulse and data pulses.

Fast rising and falling edges on PCB pulsed transmission lines may lead to reflections and non-monotonic edges in signal transitions. Edges should be controlled to make sure that the pulses sent along the serial interface bus are non-monotonic, such that the pulses may be properly transmitted by a primary device of the pulse and received by a secondary device of the pulse. Adding more regulators (e.g., buck regulators) may generate additional noise and cross talk. Cross talk from regulators and other sources may also lead to glitches and non-monotonic edges in signal transitions. Regulators may be noisy and may have sharp transitions of high power, which may couple to serial interface traces. Noise that is detected by serial interface pads, especially during the signal transitions, may be problematic because when a receiver of a serial interface signal picks up an extra pulse due to noise during an edge, the receiver may receive the extra pulse as an extra clock cycle or incorrect data. The extra clock cycle may cause read/write failures within a system. Non-monotonic edges may result in double clocking (e.g., the extra clock cycle) and the read/write failures due to poor signal integrity on the serial interface bus. Signal integrity of the serial interface bus in large systems may be an issue as the number of chips in the chipset increases and serial interface buses become longer. Thus, an improved serial interface buffer architecture that optimizes slew rates, enhances signal integrity, and/or reduces latency is needed.

Various aspects relate generally to serial interface buses. Some aspects more specifically relate to serial interface buses with glitch filtering. In some aspects, a serial interface bus may include a glitch filter. The glitch filter may receive an input signal associated with a glitch. The glitch may be a rising edge glitch or a falling edge glitch. The input signal may be a clock signal or a data signal. The glitch filter may reject the glitch based at least in part on a plurality of state machine transitions associated with the glitch filter and a set of timers associated with the glitch filter, to produce an output signal that is not associated with the glitch. The set of timers may include a high timer and a low timer, and the input signal may be locked at a high state for at least a length of the high timer and the input signal may be locked at a low state for at least a length of the low timer, in accordance with the plurality of state machine transitions. The serial interface bus may include a glitch detector. The glitch detector may detect whether the output signal from the glitch filter is still associated with any glitches. The serial interface bus may include an output driver. The output driver may include one or more switchable resistors to match an output impedance associated with the output driver with a characteristic impedance of a transmission line associated with the serial interface bus. The output driver may be associated with a programmable slew rate. The output driver may be associated with an automatic slew rate control to optimize a slew rate to match the characteristic impedance of the transmission line and minimize reflections and glitches on the serial interface bus. The glitch filter, the glitch detector, and/or the output driver may be used to improve a slew rate, signal integrity, and/or latency of signals that pass through a transmission line of the serial interface bus.

In some aspects, the serial interface bus may be associated with a high speed serial interface signal pad buffer, which may incorporate an asynchronous finite state machine (AFSM) glitch filter (or a glitch filter that is implemented with a synchronous finite state machine) and a glitch detector to achieve maximum signal integrity. The serial interface bus may be associated with a power management integrated circuit (PMIC). The serial interface bus may be based at least in part on a pad buffer architecture, which may include the AFSM glitch filter, automatic slew rate control, programmable output impedance, and/or the glitch detector. The AFSM may be based at least in part on state transitions and a latch design.

Particular aspects of the subject matter described in this disclosure can be implemented to realize one or more of the following potential advantages. In some examples, by incorporating the AFSM glitch filter, the glitch detector, the automatic slew rate control, and/or the programmable output impedance, the described techniques can be used to improve a serial interface signal integrity, thereby improving an overall system performance. The serial interface signal integrity may be a significant problem at a system level, which may lead to serial interface read/write failures between devices in the system, and cause system failures. An occurrence of serial interface read/write failures may vary significantly between different system applications and PCB layouts. The use of the AFSM glitch filter, the glitch detector, the automatic slew rate control, and/or the programmable output impedance may avoid the serial interface read/write failures between the devices in the system.

In some aspects, automatic slew rate control drivers with adjustable output impedance may produce clean monotonic edges with consistent rise/fall times, which may improve slew rates and signal integrity on the serial interface bus. A serial interface communication, with a relatively long serial interface bus with distributed loads along the serial interface bus and multiple PCB transmission line impedances, may be associated with relatively stable slew rates and robustness. Serial interface pad buffers may have a capability to automatically adjust the slew rate to match different loads and impedances. When noise glitches of a given pulse duration and/or amplitude are present in serial interface pins, such noise may be rejected along a large system bus using the AFSM glitch filter.

FIG. 1 is a diagram of an example 100 associated with a system chipset serial interface bus, in accordance with the present disclosure.

As shown in FIG. 1, a chipset may include a serial interface bus 102 for communication between devices in a system. The devices may include a primary device and multiple secondary devices. Each device may have an input capacitance of 2.5 picofarads (pF). In this example, two adjacent devices along the serial interface bus 102 may be separated by a distance of 1.5 centimeters (cm). The serial interface bus 102 may carry signals, such as a clock signal (SCLK) and/or a data signal (SDATA), which may be routed on printed circuit board (PCB) transmission lines. The serial interface bus 102 may include distributed loads of multiple devices between a driver and a receiving device (e.g., a distributed load across a pulsed transmission line).

The signals may be affected by the pulsed transmission line. For example, the clock signal may be associated with a sharp edge or a rising edge (measured at load and/or at source) and propagation delays along the serial interface bus 102. The clock signal may be sent by a primary device (e.g., a clock driver) on the pulsed transmission line. The clock signal may be sent to a load, and the clock signal may then be reflected back toward the source, depending on an impedance of the load. The reflection may cause interference and cause glitches and dips on a voltage along the serial interface bus 102. A faster edge may correspond to a more severe impact of the reflections and glitches along the serial interface bus 102. Any glitch rejection solution should be able to reject noise for an entire time window. As another example, the data signal may have a slower edge (measured at load and/or at source), as compared to the clock signal, which may cause the data signal to sit in a transition region for a longer period of time, and makes the data signal more vulnerable to coupling from a regulator. The coupling from the regulator may cause voltage dips during the transition, and the voltage dips may be received by a secondary device as an extra clock pulse or incorrect data. Decreasing an edge rate may increase the time window and use additional budget.

The rising edge of the signals (e.g., SCLK or SDATA) may launch a pulsed wave onto the pulsed transmission line. A shelf may be created due to transmission line behavior with a fast slew rate, but slowing the edge may at least partially eliminate this effect. Individual stubs and distributed loads along the serial interface bus 102 may create localized negative reflections, which may result in disturbances during signal transitions with fast slew rates. In addition, noise coupling from sources in a chipset layout (e.g., a PMIC layout) may superimpose glitches on the edge during the signal transitions with slower slew rates.

When the serial interface bus 102 is relatively long and has multiple loads and sharp rising edges, a resulting signal waveform may be associated with many disturbances, which may be due to the stubs and distributed loads on the pulsed transmission line. Instead of a clean rising edge, the resulting waveform may have rising edges and falling edges that are very non-monotonic and with many ripples (voltage dips). When the load receives such a signal, only a limited amount of rejection capabilities may be available to ignore these dips and glitches during the edges and receive the signal properly.

As indicated above, FIG. 1 is provided as an example. Other examples may differ from what is described with regard to FIG. 1.

Due to the rise in clock frequencies and more aggressive delay budgets with shorter delays required to achieve the clock frequencies, strong output drivers were implemented in order to achieve faster edges that minimize the delay. The strong output drivers may include a large pre-driver and output stage to maximize a drive strength to drive large load capacitances of multiple loads on a serial interface bus. Programmable drive strength settings were implemented in order to adjust an output drive strength level based on a system bus length and load capacitance (e.g., a number of distributes loads and a length of the serial interface bus). Different drive strength settings were used to adjust a fastness of the edges and the drive strength. Input buffers with voltage hysteresis were implemented to reject noise. Shorter system serial interface busses were implemented to run at lower frequencies. Such serial interface buses were associated with fewer devices (e.g., peripherals), and an overall PCB transmission line was shorter and had fewer chips on the serial interface buses. With fewer devices, the lower frequencies were possible, which relaxed the delay budget and allowed the edges to be run more slowly with fewer overall signal integrity problems. However, the past approaches were unable to handle systems that run at higher clock frequencies (e.g., up to 38.4 MHz) and support a relatively large number of devices.

A Schmitt trigger input buffer with voltage hysteresis was implemented to reject noise on an input that was less than a specific hysteresis window. A typical voltage hysteresis window may be approximately 10% of a supply voltage. However, glitches may exceed the 10% due to reflections on the serial interface bus. Voltage dips and pulses may be too large to be rejected by Schmitt trigger hysteresis, which may result in inherent noise problems on the serial interface bus. Noise or glitches larger than the typical hysteresis voltage due to signal integrity issues may pass through the serial interface bus and produce runt pulses on an incoming logic signal.

A primary device (e.g., a clock driver or output driver) was implemented with a set of output field-effect transistors (FETs) that were programmable to different drive strengths. The primary device included a pre-driver that drove the output FETs with different drive strength gates. The different drive strength gates would set the speed at which a capacitance of the output FETs could charge and discharge, which would correlate to a fastness of the edges on the serial interface bus. A higher drive strength would be selected for longer serial interface buses and larger bus capacitances, whereas a lower drive strength would be acceptable for shorter serial interface buses. When a maximum drive strength was used, edges would be non-linear with undershoots and shelfing during the edges due to transmission line reflections. Further, rising edge and falling edge slew rates would be relatively large.

An automatic slew rate adjusted serial interface pad would be implemented. A pre-driver would be implemented with resistors with a series of switches to drive an array of parallel pull-up and pull-down switches in an output stage. The pre-driver would be programmable to select slew rates with fixed impedance of the output stage, which would ensure that edges were not too fast or too slow. The pre-driver would have some amount of drive current capability. Slew rate control would be based at least in part on a feedback loop, but would still suffer from non-monotonicity and voltage dips on the falling edge.

Figure 2A:
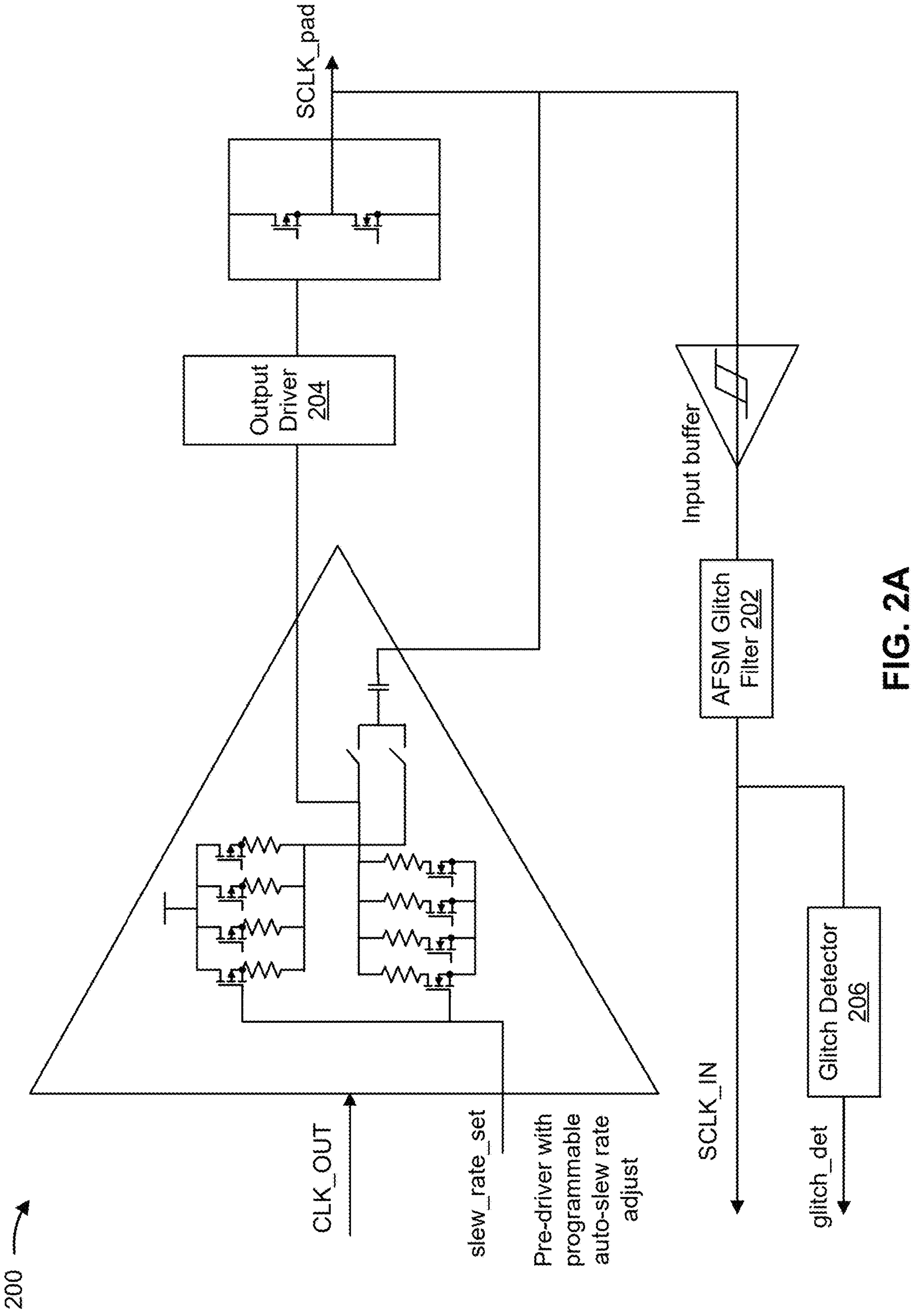
FIGS. 2A-2C are diagrams illustrating examples associated with serial interface pad buffers, in accordance with the present disclosure.
Figure 2B:
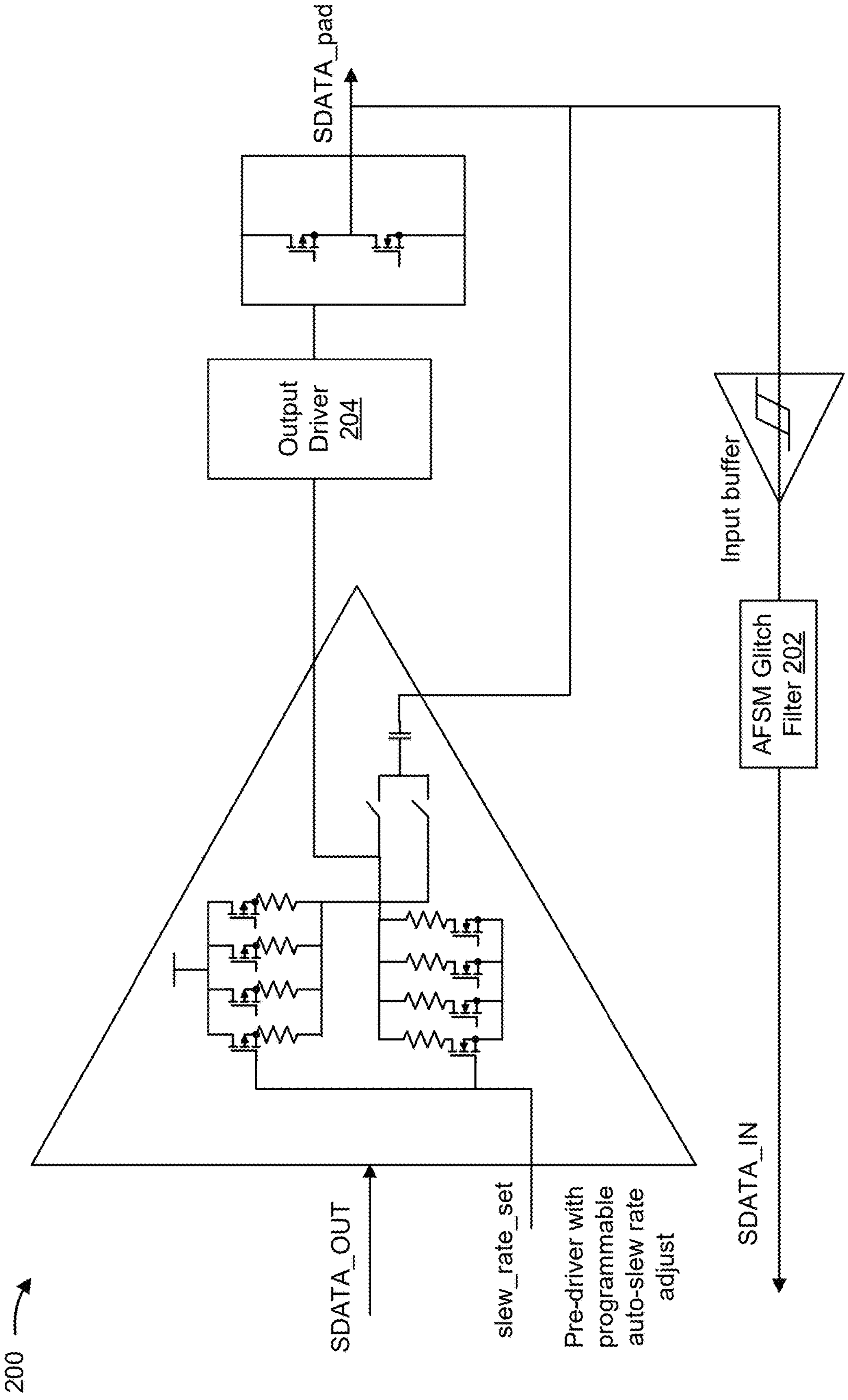
Figure 2C:
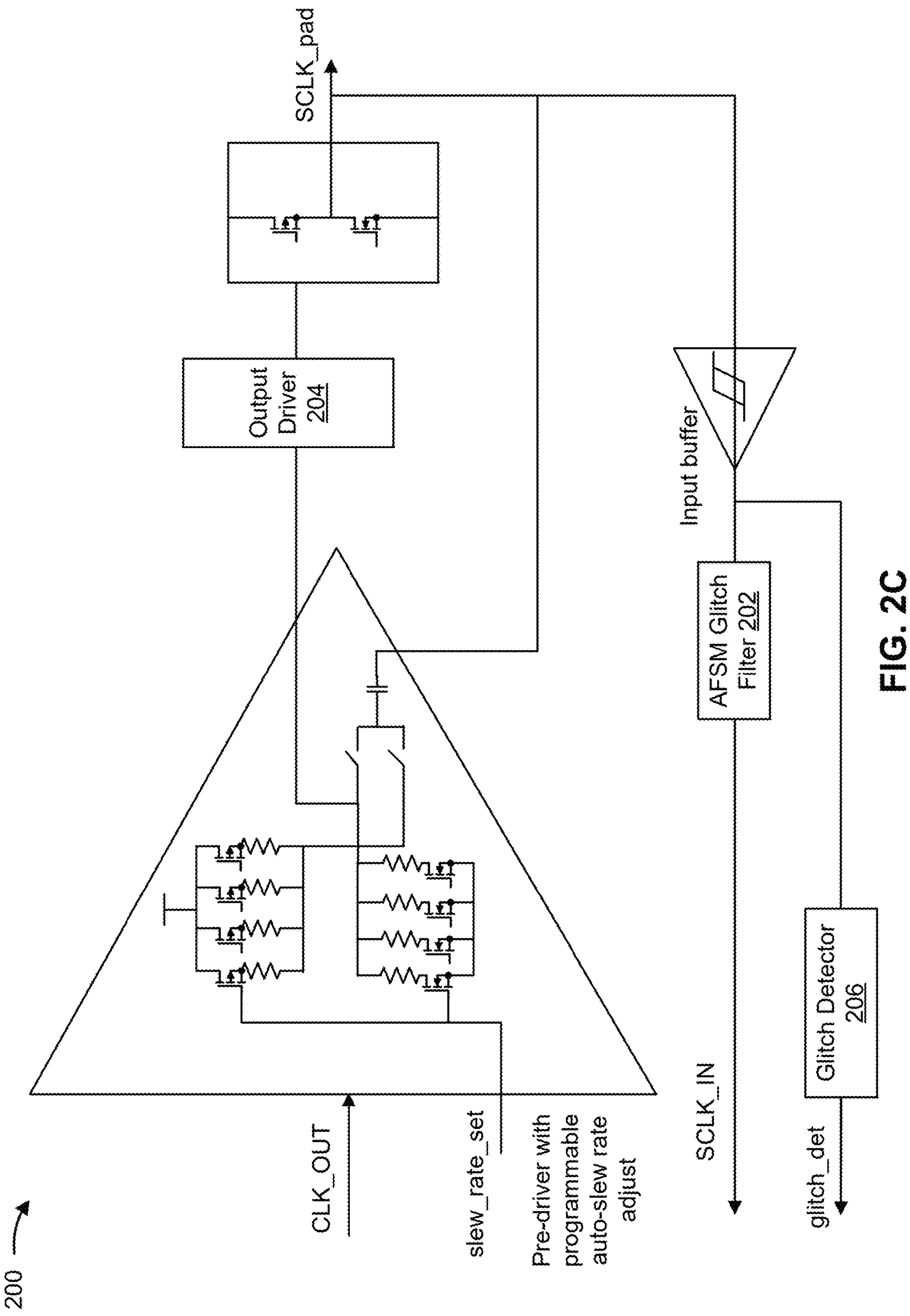

FIGS. 2A-2C are diagrams illustrating examples 200 associated with serial interface pad buffers, in accordance with the present disclosure.

Figure 5:
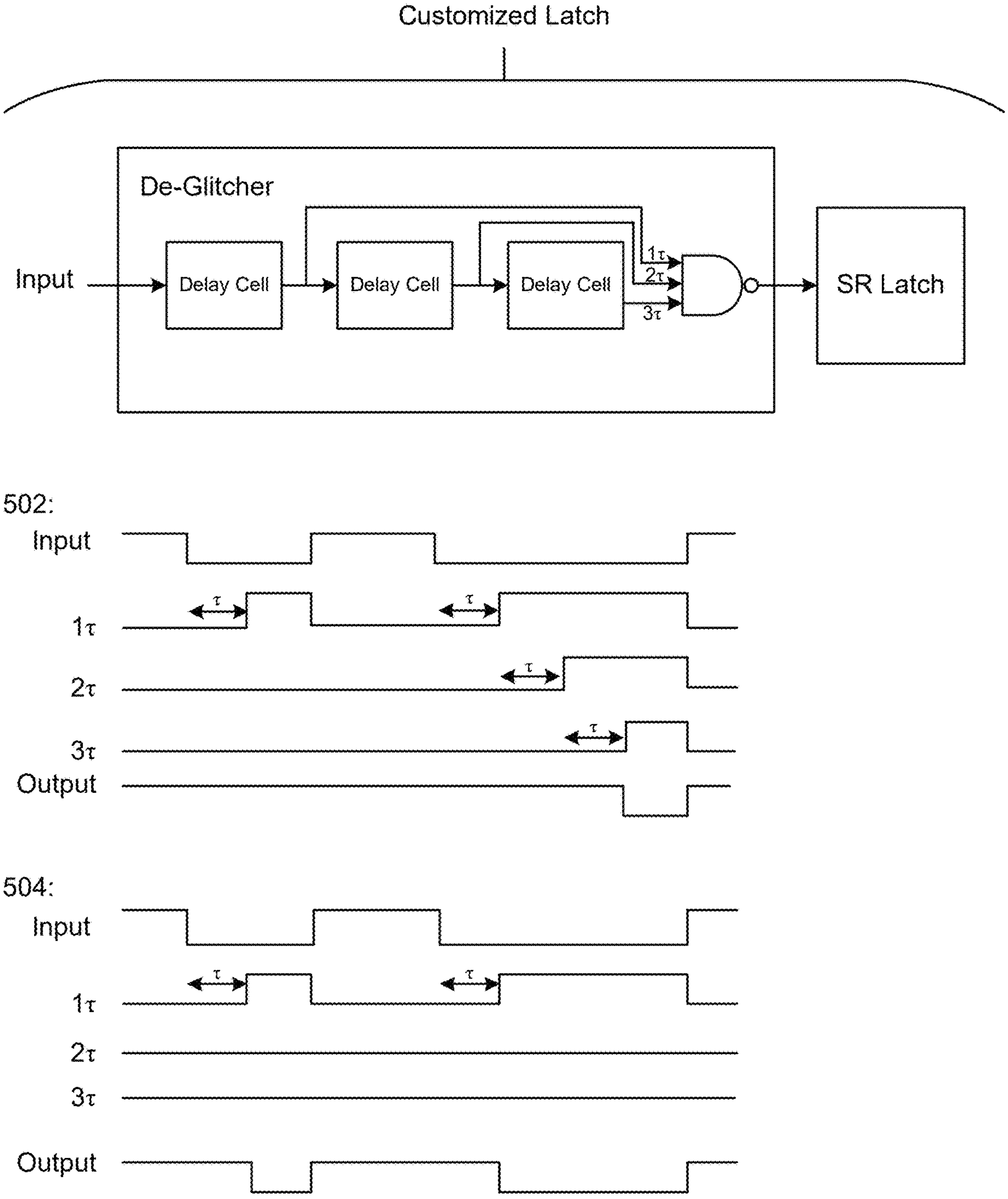
FIG. 5 is a diagram illustrating an example associated with a state machine, in accordance with the present disclosure.
Figure 6:
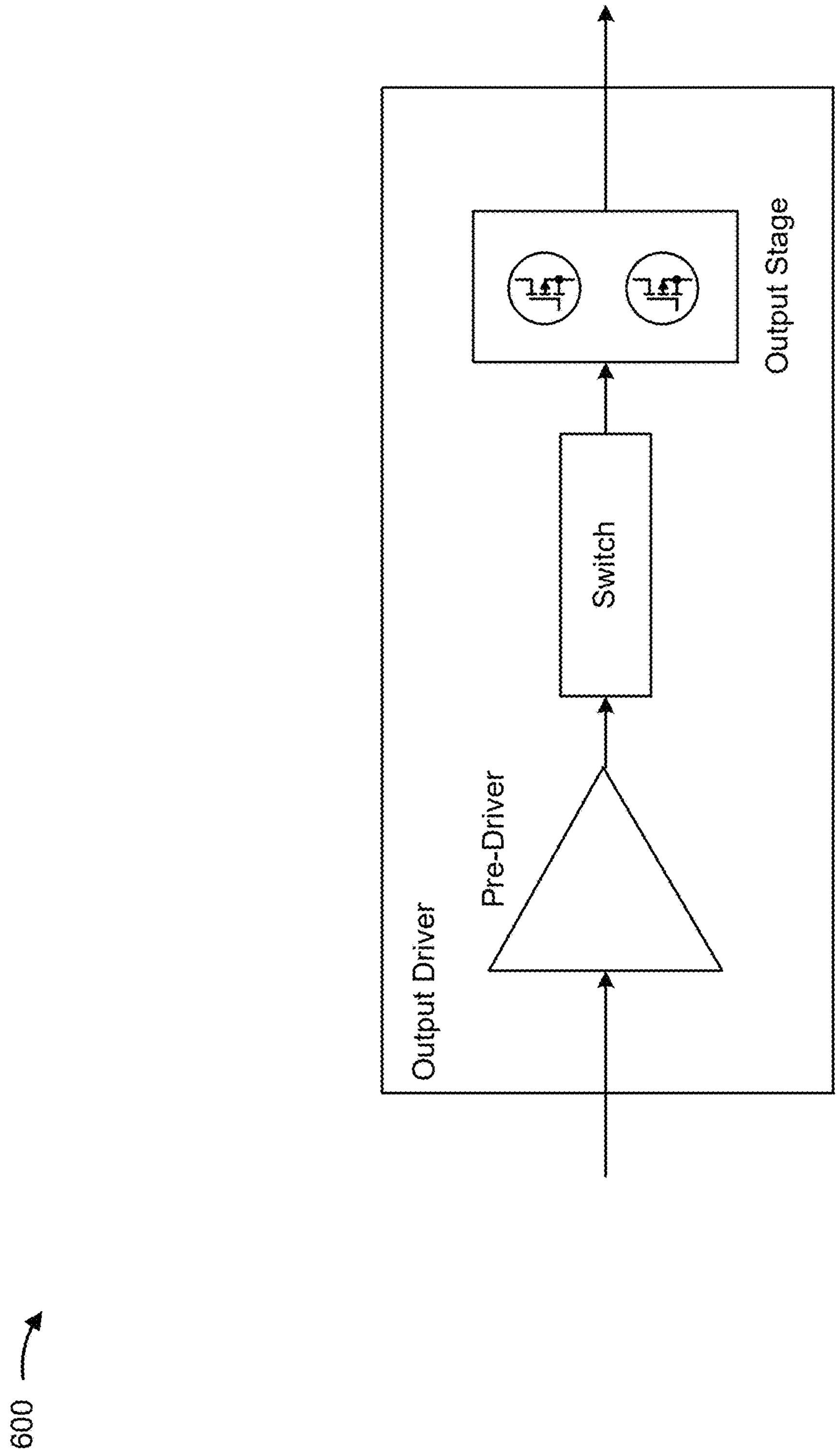
FIG. 6 is a diagram illustrating an example associated with a digital output driver, in accordance with the present disclosure.
Figure 7:
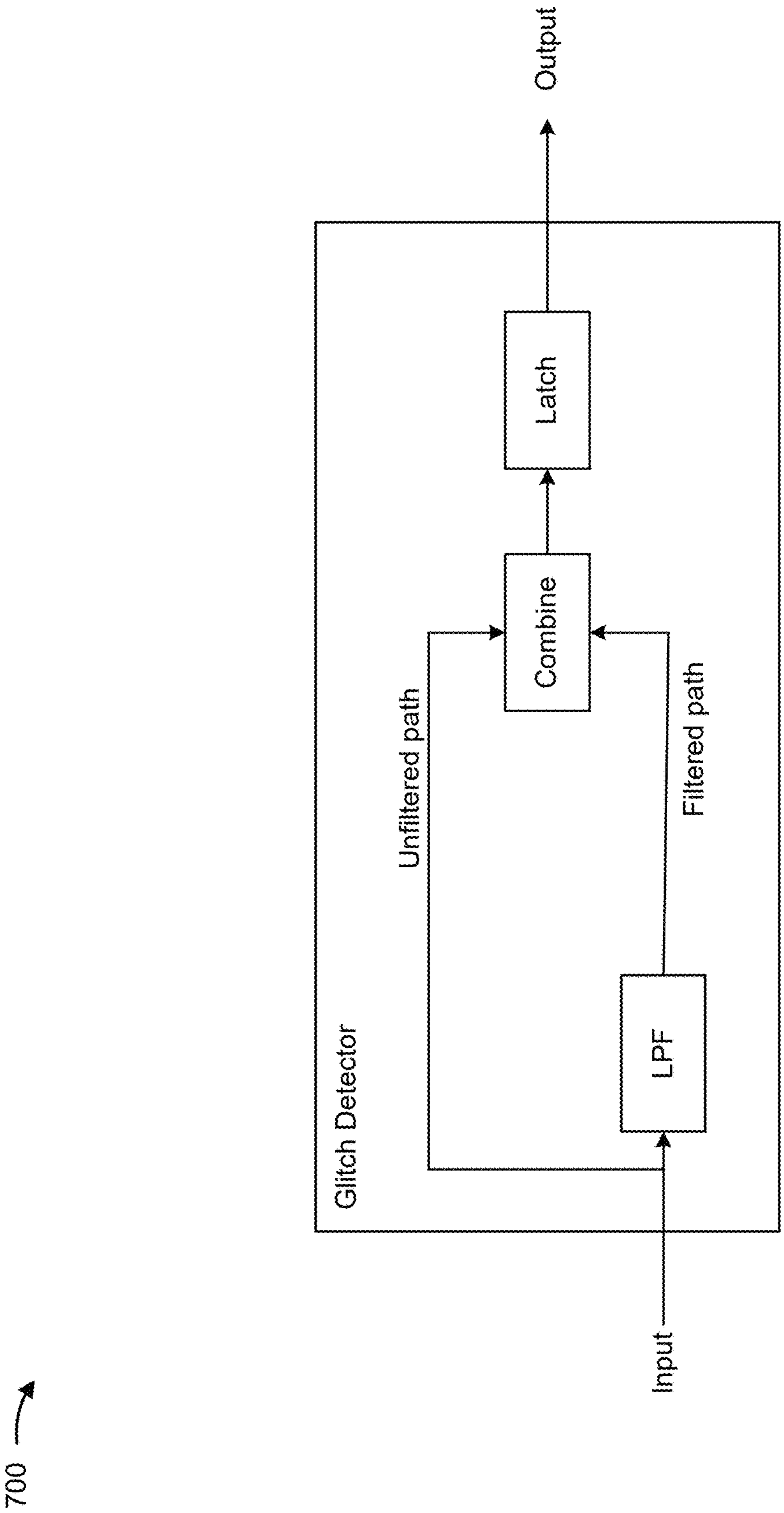
FIG. 7 is a diagram illustrating an example associated with a glitch detector, in accordance with the present disclosure.

As shown in FIGS. 2A-2C, serial interface pad buffers may include an AFSM glitch filter 202 (e.g., further shown in FIGS. 3, 4, and 5), an output driver 204 (e.g., as shown in FIG. 6), and/or a glitch detector 206 (e.g., as shown in FIG. 7). As shown in FIG. 2A, the AFSM glitch filter 202, the output driver 204, and the glitch detector 206 may be used with respect to clock signals. As shown in FIG. 2B, the AFSM glitch filter 202 and the output driver 204 may be used with respect to data signals. As shown in FIG. 2C, the glitch detector 206 may be connected directly to an SCLK pin, rather than being connected to an output of the AFSM glitch filter 202. The glitch detector 206 may detect and report glitches as sensed directly at the SCLK pin, instead of at the output of the AFSM glitch filter 202 using an AFSM filter bypass mode.

In some aspects, the AFSM glitch filter 202 may be a digital filter with programmable bandwidth settings to reject glitch pulses on a serial interface bus. The AFSM glitch filter 202 may help to reject additional pulses that have been received due to poor signal integrity or coupling at the serial interface pad buffers. The AFSM glitch filter 202 may be the digital filter on a receiving input pad buffer. The output driver 204 may have automatic slew rate control, a programmable slew rate, and a separate programmable output impedance. The output driver 204 may provide a programmable output impedance enhancement to automatic slew rate adjust pads. The glitch detector 206 may detect glitches on serial interface input pins and alert a system of cross talk or signal integrity issues on the serial interface bus. A combination of the AFSM glitch filter 202, the output driver 204, and the glitch detector 206 may be used to improve a serial interface buffer architecture that minimizes slew rates, signal integrity, and latency.

As indicated above, FIGS. 2A-2C are provided as examples. Other examples may differ from what is described with regard to FIGS. 2A-2C.

Figure 3:
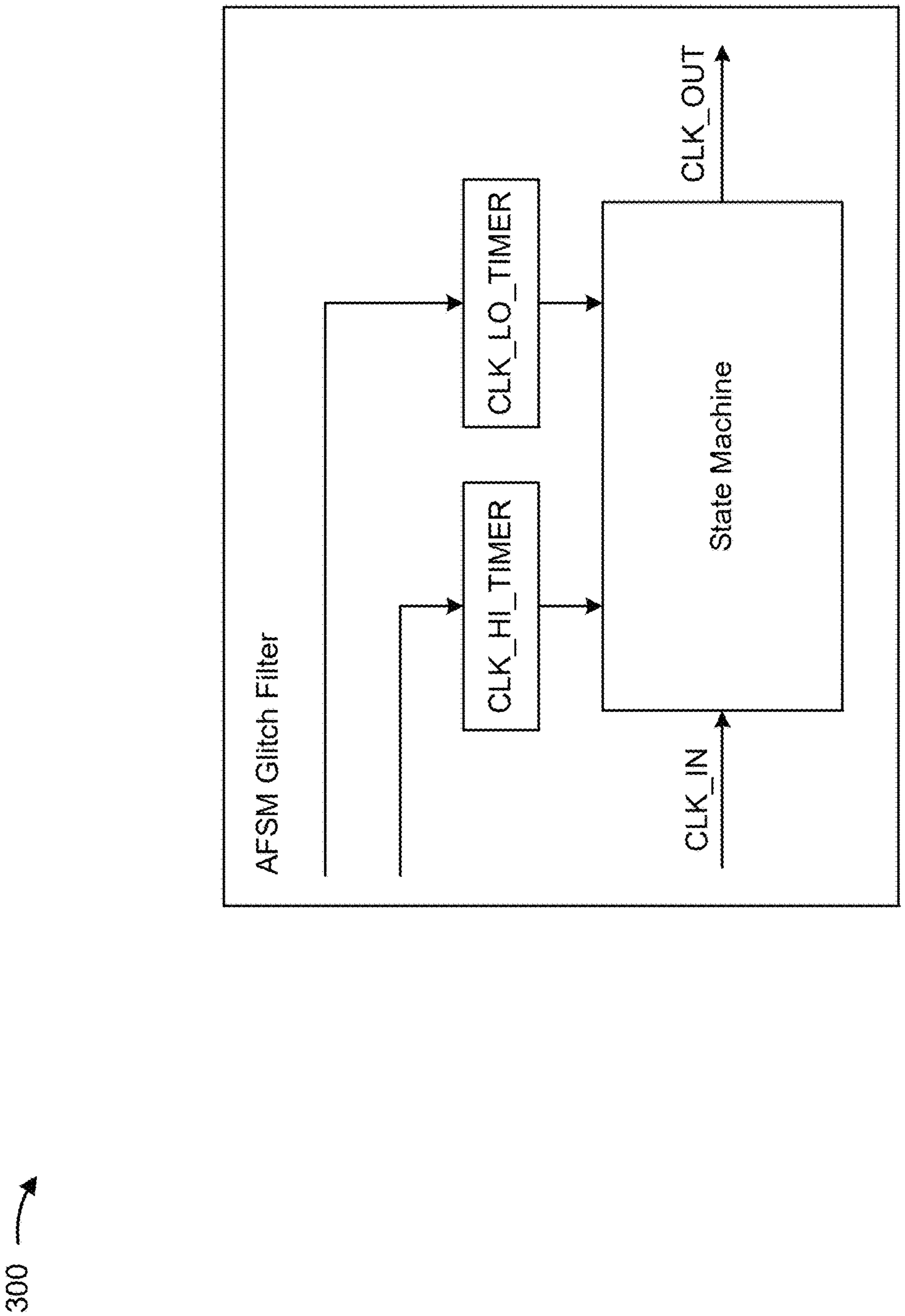
FIG. 3 is a diagram illustrating an example associated with an asynchronous finite state machine (AFSM), in accordance with the present disclosure.

FIG. 3 is a diagram illustrating an example 300 associated with an AFSM, in accordance with the present disclosure.

As shown in FIG. 3, an AFSM filter may be built with a state machine and two timers. The two timers may include a high timer (CLK_HI_TIMER) and a low timer (CLK_LO_TIMER). The state machine may receive a clock input signal (e.g., pulses of a clock signal) and produce a clock output signal, which may be based at least in part on the two timers. The state machine may sequence through as the pulses of the clock signal are received and clock the state machine from one state to a next state. In some cases, the two timers may be implemented with a shared single timer (only one active at a time), and the shared single timer may be built using an AFSM flow. The AFSM filter may involve a 4-bit selection for high/low timers (targeting desired range of 4-11 nanoseconds (ns)) and a 2-bit selection for a latch filter (0.7 ns, 0.9 ns, or 1.1 ns).

In some aspects, the AFSM filter may provide glitch edge filtering to minimize signal latency (e.g., SCLK/SDATA latency) on a filtered output. After an SCLK/SDATA state is changed to a high/low state, a minimum time for both the high/low state may be ensured. A desired minimum time may range from 4 ns to 11 ns. A separate control may be used for a high state and a low state of SCLK/SDATA. Any glitch may be blocked during this minimum time range (e.g., an output signal may be guaranteed to be in a stable state during the minimum time range). In this case, while a raw signal may be associated with edge glitches, a filtered signal that is outputted from the AFSM filter may not have such edge glitches. The AFSM filter may remove extra pulses on both edges to produce a clean signal.

In some aspects, certain edges may be associated with non-monotonic behavior on both rising edges and falling edges, and when that signal is received by an input pad buffer of a load, a raw input signal may become amplified. Noise may be amplified enough to produce extra pulses within a signal waveform. Glitches may occur on the rising edges and/or the falling edges due to additional noise, which may break communication in a system. The AFSM filter may use the two timers and the state machine to remove the glitches, which may effectively remove noise on both the rising edges and the falling edges.

In some aspects, the state machine may be associated with different state transitions. The state machine may start in a reset state. The state machine may be implemented using various timers (e.g., the high timer and the low timer) and a special latch. The latch may prevent transitions in the state machine for edges that are below a certain value (e.g., a target value of approximately 1 ns). The value may be programmable. The state machine may not transition at all when pulse widths are narrower than a threshold, which may be determined based at least in part on the latch. When a signal is received that has a rising edge and a transition is allowed, the high timer may be employed. The high timer may not allow the signal to change again until the high timer expires. When the rising edge is seen and the signal has not risen and fallen in less than 1 ns (which can occur with glitches), the signal may rise high and stay high. In this case, the signal may be locked so that the signal remains high for a given period of time before the signal is allowed to transition again on an output of the AFSM filter. After the high timer expires, a falling edge may be allowed. The latch may prevent any narrow glitch falling edges. The signal may be locked during the falling edge for a certain period of time, which may be defined by the low timer. The high and low timers may serve to lock a signal for a minimum amount of time, and the latch may prevent a reaction to narrow pulses less than a programmable pulse width of roughly 1 ns.

In some aspects, the latch may be an AFSM latch for edge detection filtering of SCLK/SDATA signals. The latch may be a part of the state machine that prevents quick transitions. The latch may be a custom latch that is formed using a set-reset (SR) latch and at least one de-glitcher with delay cells. The latch may be composed of standard library digital cells. The latch may prevent transitions of the AFSM for input clock pulses narrower than a filter setting. When a signal is received by the de-glitcher, the signal should remain high for a minimum number of delay cells (e.g., three delay cells) in order to properly drive the SR latch and allow a transition. The de-glitcher may ensure that the signal stays at the same state for several delay pulses before the signal is allowed to transition. An amount of delay associated with each delay cell may be programmable. A signal transition may not be allowed until the amount of delay has passed (e.g., no output transition is allowed). When a pulse has gone high and stayed high, the pulse is allowed to propagate through to an output, which may trigger the SR latch and allow the signal transition within the state machine.

As an example, the AFSM filter may be capable of rejecting some pulses. A signal may have a narrow 400 picosecond (ps) glitch in which an edge is increased for 400 ps, the signal becomes low for 200 ps, and then the signal comes back high and remains high for a remainder of a clock pulse. In this example, the AFSM filter may not allow a transition to occur during the glitch. In other words, the AFSM filter may reject the glitch. The AFSM filter may wait a finite amount of delay and then allow the edge to come high, and then a high timer will keep the edge high for a fixed amount of time before the signal is allowed to transition low. A 200 ps glitch may be ignored, and an SCLK OUT signal may be generated approximately 1.8 ns after a first rising edge on an SCLK IN signal. Other glitch behavior may be rejected as well due to the high timer. The AFSM filter may be capable of rejecting glitches on both rising edges and falling edges. The AFSM filter may be capable of rejecting noise on rising and/or falling edges to produce a clean pulse into a digital receiver.

As indicated above, FIG. 3 is provided as an example. Other examples may differ from what is described with regard to FIG. 3.

Figure 4:
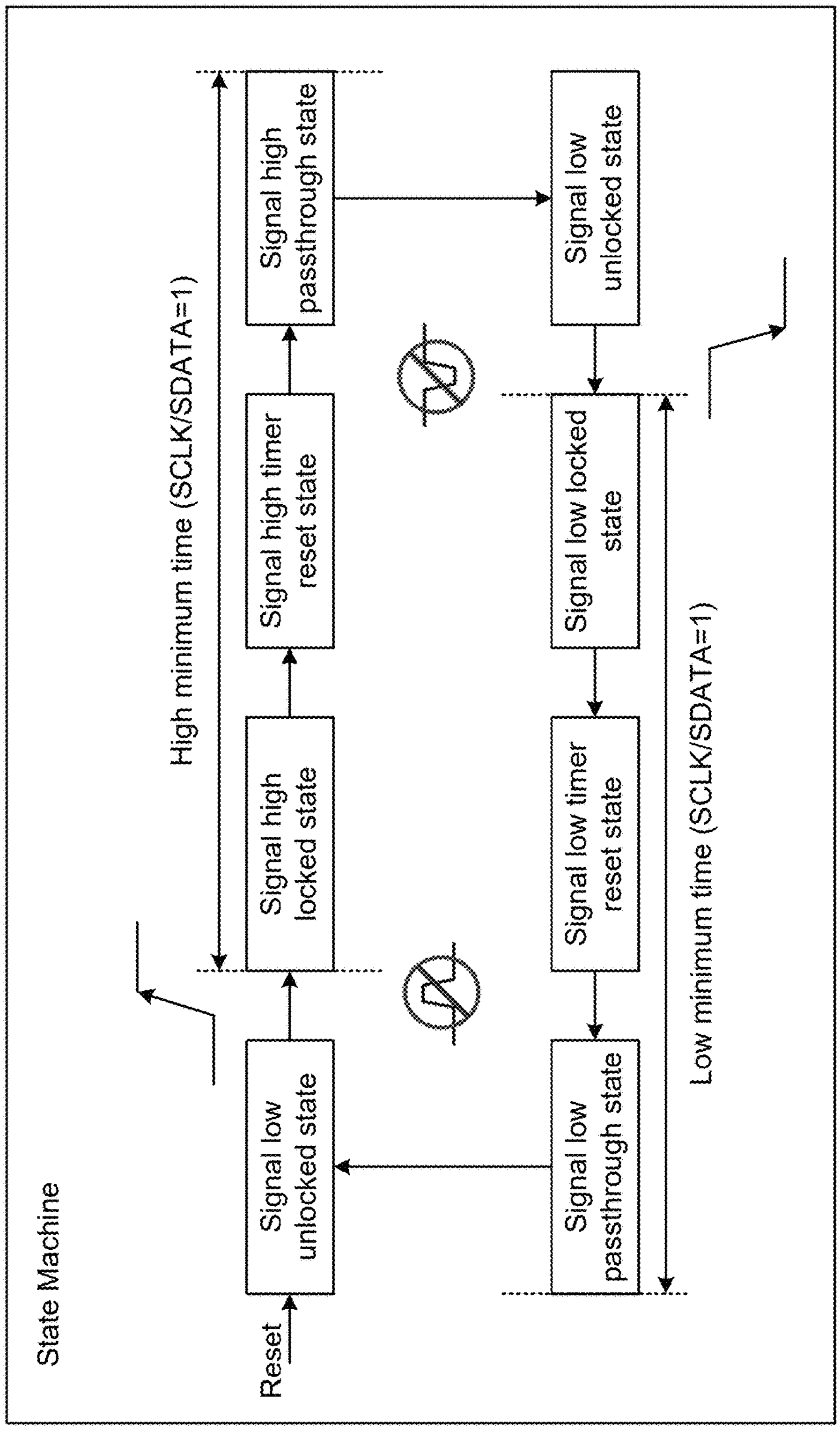
FIG. 4 is a diagram illustrating an example associated with AFSM filter state transitions, in accordance with the present disclosure.

FIG. 4 is a diagram illustrating an example 400 associated with AFSM filter state transitions, in accordance with the present disclosure.

As shown in FIG. 4, AFSM filter state transitions may include various states, such as a signal low unlocked state, a signal high locked state, a signal high timer reset state, a signal high passthrough state, a signal high unlocked state, a signal low locked state, a signal low timer reset state, and a signal low passthrough state. A high minimum time (SCLK/SDATA=1) may correspond to the signal high locked state, the signal high timer reset state, and the signal high passthrough state. A low minimum time (SCLK/

SDATA=0) may correspond to the signal low locked state, the signal low timer reset state, and the signal low pass-through state.

As indicated above, FIG. 4 is provided as an example. Other examples may differ from what is described with regard to FIG. 4.

FIG. 5 is a diagram illustrating an example 500 associated with a customized latch, in accordance with the present disclosure.

In some aspects, an AFSM filter may include a customized latch. The customized latch may be formed based at least in part on a de-glitcher and a latch, such as an SR latch. The de-glitcher may include a plurality of delay cells, which each delay cell may add a different level of delay to an input signal. For example, a first delay cell may add a 1τ delay to the input signal, a second delay cell may add a 2τ delay to the input signal, and/or a third delay cell may add a 3τ delay to the input signal, where τ is a delay. An output of the first delay cell may be a signal with the 1τ delay, an output of the second delay cell may be a signal with the 2τ delay, and an output of the third delay cell may be a signal with the 31 delay. The delay cells and the SR latch may be an implementation of the customized latch, which may be used in multiple instances to build a state machine. A NAND gate with programmable delay settings may be used to select a minimum pulse width required to allow the AFSM filter to make transitions. For example, using the NAND gate, an output signal may be based at least in part on the input signal with the 1τ delay, the input signal with the 2τ delay, and/or the input signal with the 3τ delay.

As shown by reference number 502, in a first timing diagram, a delay setting for the latch may be 0x11, which is 3τ. A duration of a first input pulse on the input signal may only last for 1τ, so the input signal may be rejected by the latch and does not produce a transition on an output. A duration of a second input pulse may last for more than 3τ. In this case, the second input pulse may be long enough to exceed a filter setting of 3τ, and the latch may create a transition on the output from high to low after 3τ. As shown by reference number 504, in a second timing diagram, a delay setting for the latch may be 0x00, which is 1τ. A duration of a first input pulse may be greater than 1τ but less than 3τ. In this case, the first input pulse may be long enough to trigger the latch. An output may transition from high to low after 1τ for this filter setting.

As indicated above, FIG. 5 is provided as an example. Other examples may differ from what is described with regard to FIG. 5.

FIG. 6 is a diagram illustrating an example 600 associated with a digital output driver, in accordance with the present disclosure.

As shown in FIG. 6, the digital output driver may be an automatic slew rate output driver with a selectable output impedance to match a bus impedance. The digital output driver may include a pre-driver, a switch (or multiple switches), and an output stage. Switches may be added between the pre-driver and the output stage to change an output impedance of the output driver to different values (e.g., 25 Ω or 40Ω) to best match a characteristic impedance of a serial interface bus transmission line and a distributed load capacitance in a variety of systems. The selectable output impedance may match the output driver to system loads and to a serial interface bus to minimize reflections, glitches, and bus errors. The output impedance may be set to predefined values (e.g., 25Ω or 40Ω) based at least in part on the characteristic impedance of the serial interface bus transmission line, which may be known ahead of time. For example, in a manufacturing phase, one or more switches may be employed, where a quantity of the one or more switches and/or a design of the one or more switches may depend on a desired output impedance.

In some aspects, the digital output driver may employ an automatic slew rate control (e.g., at the output stage), which may have an additional multiplexer network. The automatic slew rate control may be used to match an output impedance of the output driver to a transmission line, which may allow a pre-drive strength to be separated from the output impedance. A fixed output impedance may be selected that best represents the output impedance of the serial interface bus. In some cases, the serial interface bus may be relatively long with numerous loads. The impedance may be 25 Ω on shorter serial interface buses with fewer loads, or the impedance may be 50-60 Ω on longer serial interface buses with numerous loads. Separating the pre-drive strength from the output impedance may allow edges and slew rates to be controlled, such that monotonic edges may be formed independent of the output impedance. The output impedance may be matched to a desired system. Smaller systems may use a higher output impedance setting, and larger systems with larger buses may use a lower output impedance setting with the same pre-drive strength. A decoupling of the output impedance from the pre-drive strength may allow for cleaner edges on an output to be produced on the output driver. The automatic slew rate control may still have remaining glitches on the falling edge, but by matching the output impedance with an actual system bus impedance, cleaner edges may be produced. The automatic slew rate control may be independent from the selectable output impedance. By employing both the selectable output impedance and the automatic slew rate control, the linearity of rising and falling edges may be improved, which may drive the same transmission line with separate programmable slew rate and output impedance settings to match the load and impedance of the system serial interface bus. Slew rate driver improvements may prevent glitches to go into an AFSM filter, which would otherwise result in a latency penalty.

As indicated above, FIG. 6 is provided as an example. Other examples may differ from what is described with regard to FIG. 6.

FIG. 7 is a diagram illustrating an example 700 associated with a glitch detector, in accordance with the present disclosure.

As shown in FIG. 7, the glitch detector may include a low-pass filter (LPF). The LPF may be coupled to a filtered signal path. The glitch detector may also include an unfiltered signal path. An input signal may be received by the glitch detector, where a first portion of the input signal may be directed to the unfiltered signal path and a second portion of the input signal may be directed to the filtered signal path. A signal on the unfiltered signal path may be divided by two, and a signal on the filtered signal path may be divided by two. Resulting signals from the unfiltered signal path and the filtered signal path may be combined (e.g., using an XOR operation) and a resulting signal may be latched. A glitch pulse may be produced when any narrow pulses on the unfiltered signal path are not detected on the filtered signal path.

In some aspects, the glitch detector may be used to report whether any glitches occur at an output of an AFSM filter. When a glitch is present in a system, a glitch detector output may be low with the AFSM filter in normal mode. The glitch detector may go high after the AFSM filter is programmed into a bypass mode. The glitch detector may compare a divided down version of an input signal with divided down unfiltered and filtered versions of the input signal. The divided down unfiltered and filtered versions of the input signal may correspond to the unfiltered signal path and the filtered signal path, respectively. When different numbers of edges are present between the two signal paths, a combined signal (e.g., an XOR signal) based at least in part on the unfiltered signal path and the filtered signal path may be high during a falling edge, and a glitch detector output may be latched. The glitch detector output may be latched into a read-only register. The glitch detector may be used for testing and debugging an effectiveness of the AFSM filter during data traffic on PCB layouts. The glitch detector may be used for detecting a presence of noise coupling and signal integrity issues in the system. The AFSM filter may reject glitches, but may not have an ability to detect and report the glitches. The glitch detector may allow for glitches to be detected so that the system may be notified when the glitches occur. When glitches are known to occur based at least in part on the glitch detector, and an output of the AFSM filter does not produce glitches, then the AFSM filter may be verified in order to effectively reject the glitches.

In some aspects, glitch detector waveforms may be produced for a first scenario involving a clean SCLK signal and a second scenario involving an SCLK signal with rising and falling edge glitches. For both scenarios, the glitch detector waveforms may be produced for an input signal (e.g., SCLK signal), the filtered signal path, and the unfiltered signal path. The glitch detector waveforms may indicate glitches that are present. For example, a waveform associated with the unfiltered signal path may show the glitches, a waveform associated with the filtered signal path may not show the glitches, and a waveform associated with an XOR operation may show a difference between the unfiltered signal path and the filtered signal path. A glitch detection output may indicate whether a glitch has occurred. Thus, the glitch filter may detect and report glitches on rising edges and/or falling edges of an input clock signal.

As indicated above, FIG. 7 is provided as an example. Other examples may differ from what is described with regard to FIG. 7.

Figure 8:
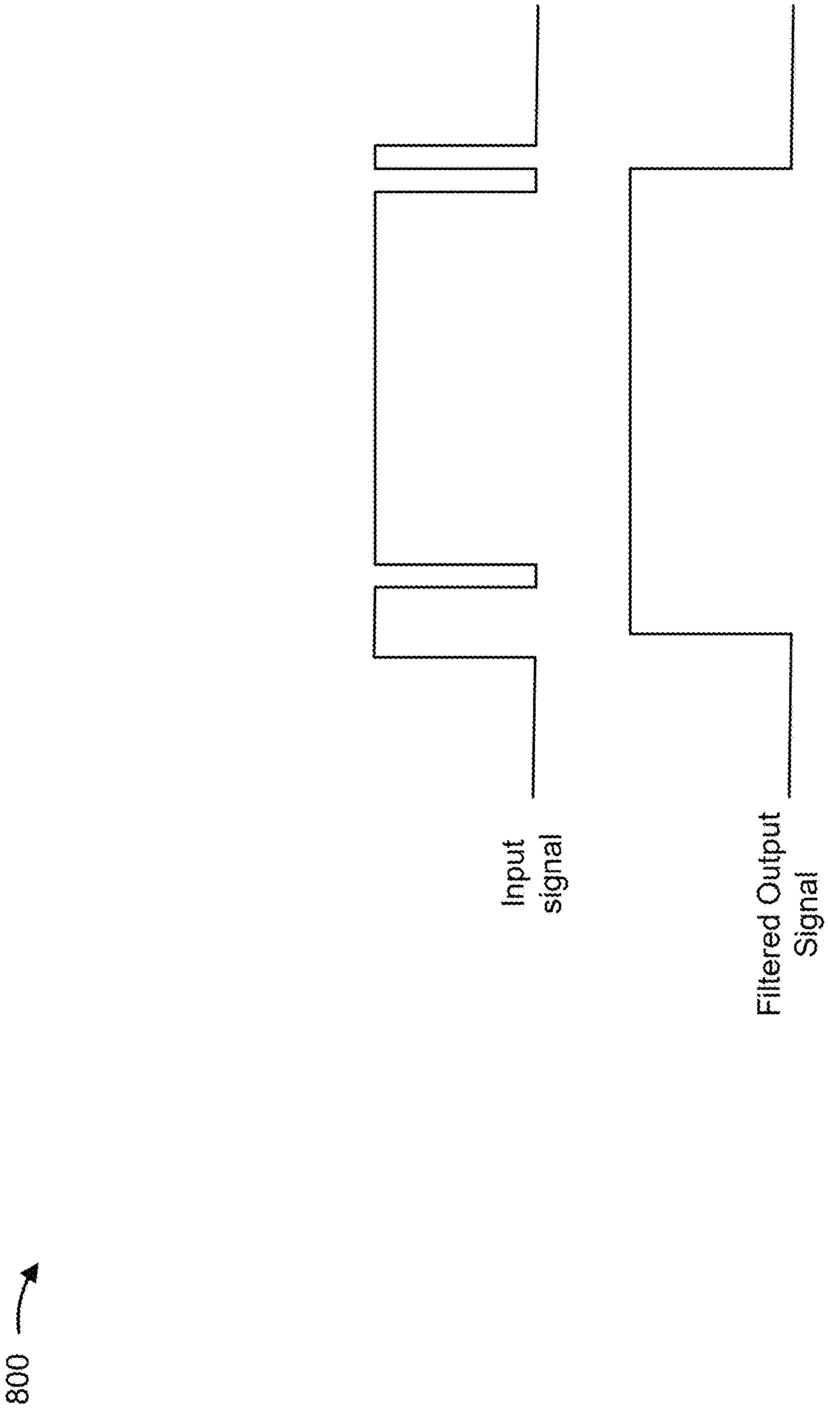
FIG. 8 is a diagram illustrating an example associated with an input signal and a filtered output signal, in accordance with the present disclosure.

FIG. 8 is a diagram illustrating an example 800 associated with an input signal and a filtered output signal, in accordance with the present disclosure.

As shown in FIG. 8, an input signal may be associated with rising edge and falling edge glitches. The input signal may pass through an AFSM filter, a digital output driver, and/or a glitch detector. An output signal may be a clean signal that is free of the rising edge and falling edge glitches. A combination of the AFSM filter, the digital output driver, and/or the glitch detector may remove the rising edge and falling edge glitches from the input signal, which may result in an overall improvement in terms of signal integrity.

As indicated above, FIG. 8 is provided as an example. Other examples may differ from what is described with regard to FIG. 8.

Figure 9:
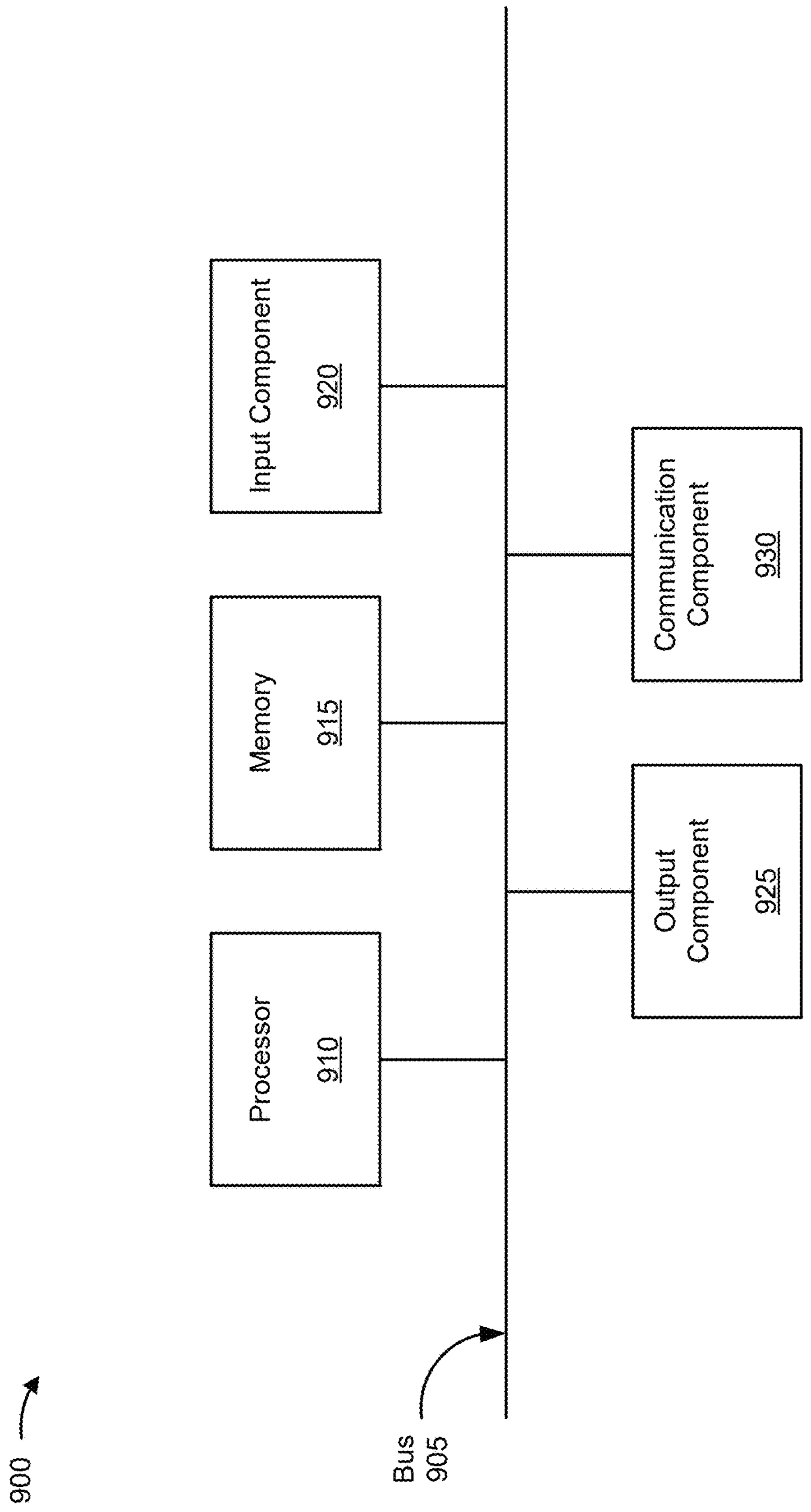
FIG. 9 is a diagram illustrating example components of a device, in accordance with the present disclosure.

FIG. 9 is a diagram illustrating example components of a device 900, in accordance with the present disclosure. The device 900 may include or be associated with a serial interface bus. As shown in FIG. 9, the device 900 may include a bus 905, a processor 910, a memory 915, an input component 920, an output component 925, and/or a communication component 930.

The bus 905 may include one or more components that enable wired and/or wireless communication among the components of the device 900. The bus 905 may couple together two or more components of FIG. 9, such as via operative coupling, communicative coupling, electronic coupling, and/or electric coupling. For example, the bus 905 may include an electrical connection (e.g., a wire, a trace, and/or a lead) and/or a wireless bus. The processor 910 may include a central processing unit, a graphics processing unit, a microprocessor, a controller, a microcontroller, a digital signal processor, a field-programmable gate array, an application-specific integrated circuit, and/or another type of processing component. The processor 910 may be implemented in hardware, firmware, or a combination of hardware and software. In some aspects, the processor 910 may include one or more processors capable of being programmed to perform one or more operations or processes described elsewhere herein.

The memory 915 may include volatile and/or nonvolatile memory. For example, the memory 915 may include random access memory (RAM), read only memory (ROM), a hard disk drive, and/or another type of memory (e.g., a flash memory, a magnetic memory, and/or an optical memory). The memory 915 may include internal memory (e.g., RAM, ROM, or a hard disk drive) and/or removable memory (e.g., removable via a universal serial bus connection). The memory 915 may be a non-transitory computer-readable medium. The memory 915 may store information, one or more instructions, and/or software (e.g., one or more software applications) related to the operation of the device 900. In some aspects, the memory 915 may include one or more memories that are coupled (e.g., communicatively coupled) to one or more processors (e.g., processor 910), such as via the bus 905. Communicative coupling between a processor 910 and a memory 915 may enable the processor 910 to read and/or process information stored in the memory 915 and/or to store information in the memory 915.

The input component 920 may enable the device 900 to receive input, such as user input and/or sensed input. For example, the input component 920 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 925 may enable the device 900 to provide output, such as via a display, a speaker, and/or a light-emitting diode. The communication component 930 may enable the device 900 to communicate with other devices via a wired connection and/or a wireless connection. For example, the communication component 930 may include a receiver, a transmitter, a transceiver, a modem, a network interface card, an antenna, and/or one or more PMIC devices.

The device 900 may perform one or more operations or processes described herein. For example, a non-transitory computer-readable medium (e.g., memory 915) may store a set of instructions (e.g., one or more instructions or code) for execution by the processor 910. The processor 910 may execute the set of instructions to perform one or more operations or processes described herein. In some aspects, execution of the set of instructions, by one or more processors 910, causes the one or more processors 910 and/or the device 900 to perform one or more operations or processes described herein. In some aspects, hardwired circuitry may be used instead of or in combination with the instructions to perform one or more operations or processes described herein. Additionally, or alternatively, the processor 910 may be configured to perform one or more operations or processes described herein. Thus, aspects described herein are not limited to any specific combination of hardware circuitry and software.

The number and arrangement of components shown in FIG. 9 are provided as an example. The device 900 may include additional components, fewer components, different components, or differently arranged components than those shown in FIG. 9. Additionally, or alternatively, a set of components (e.g., one or more components) of the device 900 may perform one or more functions described as being performed by another set of components of the device 900.

Figure 10:
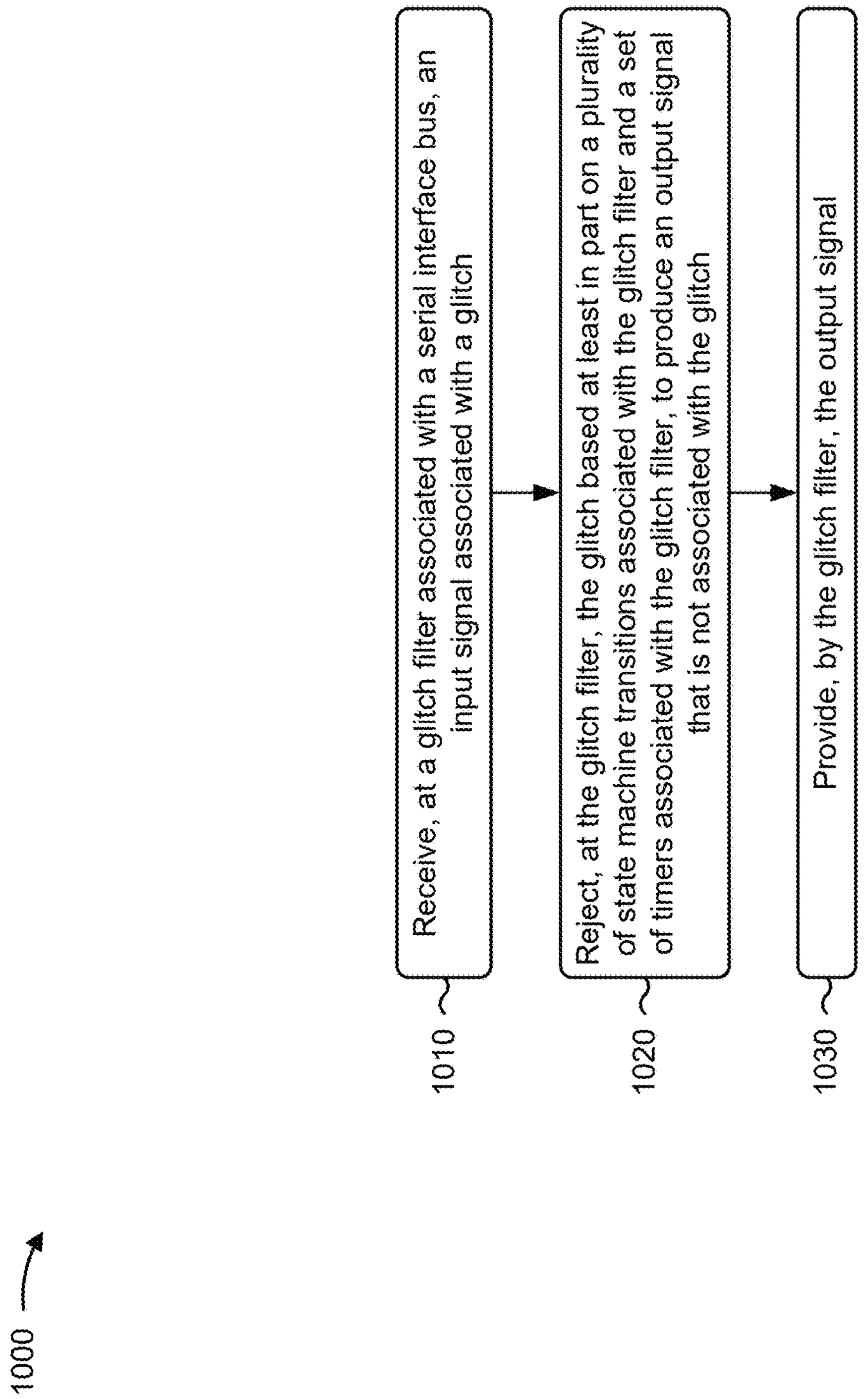
FIG. 10 is a flowchart of an example process associated with a serial interface bus with glitch filtering, in accordance with the present disclosure.

FIG. 10 is a flowchart of an example process 1000 associated with a serial interface bus with glitch filtering, in accordance with the present disclosure. In some implementations, one or more process blocks of FIG. 10 are performed by a glitch filter (e.g., glitch filter 202) associated with a serial interface bus (e.g., serial interface bus 102). In some implementations, one or more process blocks of FIG. 10 are performed by another device or a group of devices separate from or including the glitch filter, such as an output driver (e.g., output driver 204) and/or a glitch detector (e.g., glitch detector 206). Additionally, or alternatively, one or more process blocks of FIG. 10 may be performed by one or more components of device 900, such as processor 910, memory 915, input component 920, output component 925, and/or communication component 930.

As shown in FIG. 10, process 1000 may include receiving, by a glitch filter associated with a serial interface bus, an input signal associated with a glitch (block 1010). For example, the glitch filter may receive, by a glitch filter associated with a serial interface bus, an input signal associated with a glitch, as described above.

As further shown in FIG. 10, process 1000 may include rejecting, by the glitch filter, the glitch based at least in part on a plurality of state machine transitions associated with the glitch filter and a set of timers associated with the glitch filter, to produce an output signal that is not associated with the glitch (block 1020). For example, the glitch filter may reject, by the glitch filter, the glitch based at least in part on a plurality of state machine transitions associated with the glitch filter and a set of timers associated with the glitch filter, to produce an output signal that is not associated with the glitch, as described above.

As further shown in FIG. 10, process 1000 may include providing the output signal (block 1030). For example, the glitch filter may provide the output signal, as described above.

Process 1000 may include additional implementations, such as any single implementation or any combination of implementations described below and/or in connection with one or more other processes described elsewhere herein.

In a first implementation, the glitch filter is a synchronous finite state machine, or the glitch filter is an AFSM digital filter.

In a second implementation, alone or in combination with the first implementation, the set of timers includes a high timer and a low timer, and the input signal is locked at a high state for at least a length of the high timer and the input signal is locked at a low state for at least a length of the low timer, in accordance with the plurality of state machine transitions.

In a third implementation, alone or in combination with one or more of the first and second implementations, the glitch filter is associated with one or more delay cells and a latch, wherein an input signal level is maintained for the one or more delay cells, and the latch prevents transitions of the input signal that are narrower than a programmable bandwidth setting.

In a fourth implementation, alone or in combination with one or more of the first through third implementations, the input signal is received from an output driver associated with the serial interface bus, wherein the output driver includes one or more switchable resistors to match an output impedance associated with the output driver with a characteristic impedance of a transmission line associated with the serial interface bus, the output driver is associated with a programmable slew rate, and the output driver is associated with an automatic slew rate control to optimize a slew rate to match the characteristic impedance of the transmission line and minimize reflections and glitches on the serial interface bus.

In a fifth implementation, alone or in combination with one or more of the first through fourth implementations, the glitch is a first glitch, and process 1000 includes detecting, using a glitch detector associated with the serial interface bus, whether the output signal is associated with a second glitch, wherein the glitch detector is associated with a debugging of the glitch filter, and generating, at the glitch detector, an indication that the second glitch is associated with the output signal.

In a sixth implementation, alone or in combination with one or more of the first through fifth implementations, the glitch is a rising edge glitch or a falling edge glitch.

In a seventh implementation, alone or in combination with one or more of the first through sixth implementations, the input signal is a clock signal or a data signal.

In an eighth implementation, alone or in combination with one or more of the first through seventh implementations, the serial interface bus is associated with a PMIC.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

The following provides an overview of some Aspects of the present disclosure:

Aspect 1: A method, comprising: receiving, by a glitch filter associated with a serial interface bus, an input signal associated with a glitch; rejecting, by the glitch filter, the glitch based at least in part on a plurality of state machine transitions associated with the glitch filter and a set of timers associated with the glitch filter, to produce an output signal that is not associated with the glitch; and providing, by the glitch filter, the output signal.

Aspect 2: The method of Aspect 1, wherein the glitch filter is a synchronous finite state machine, or the glitch filter is an asynchronous finite state machine (AFSM) digital filter.

Aspect 3: The method of any of Aspects 1-2, wherein the set of timers includes a high timer and a low timer, and the input signal is locked at a high state for at least a length of the high timer and the input signal is locked at a low state for at least a length of the low timer, in accordance with the plurality of state machine transitions.

Aspect 4: The method of any of Aspects 1-3, wherein the glitch filter is associated with one or more delay cells and a latch, wherein an input signal level is maintained for the one or more delay cells, and the latch prevents transitions of the input signal that are narrower than a programmable bandwidth setting.

Aspect 5: The method of any of Aspects 1-4, wherein the input signal is received from an output driver associated with the serial interface bus, wherein the output driver includes one or more switchable resistors to match an output impedance associated with the output driver with a characteristic impedance of a transmission line associated with the serial interface bus, the output driver is associated with a programmable slew rate, and the output driver is associated with an automatic slew rate control to optimize a slew rate to match the characteristic impedance of the transmission line and minimize reflections and glitches on the serial interface bus.

Aspect 6: The method of any of Aspects 1-5, wherein the glitch is a first glitch, and further comprising: detecting, using a glitch detector associated with the serial interface bus, whether the output signal is associated with a second glitch, wherein the glitch detector is associated with a debugging of the glitch filter; and generating, at the glitch detector, an indication that the second glitch is associated with the output signal.

Aspect 7: The method of any of Aspects 1-6, wherein the glitch is a rising edge glitch or a falling edge glitch.

Aspect 8: The method of any of Aspects 1-7, wherein the input signal is a clock signal or a data signal.

Aspect 9: The method of any of Aspects 1-8, wherein the serial interface bus is associated with a power management integrated circuit (PMIC).

Aspect 10: An apparatus at a device, the apparatus comprising one or more processors; one or more memories coupled with the one or more processors; and instructions stored in the one or more memories and executable by the one or more processors to cause the apparatus to perform the method of one or more of Aspects 1-9.

Aspect 11: An apparatus at a device, the apparatus comprising one or more memories and one or more processors coupled to the one or more memories, the one or more processors configured to cause the device to perform the method of one or more of Aspects 1-9.

Aspect 12: An apparatus comprising at least one means for performing the method of one or more of Aspects 1-9.

Aspect 13: A non-transitory computer-readable medium storing code, the code comprising instructions executable by one or more processors to perform the method of one or more of Aspects 1-9.

Aspect 14: A non-transitory computer-readable medium storing a set of instructions, the set of instructions comprising one or more instructions that, when executed by one or more processors of a device, cause the device to perform the method of one or more of Aspects 1-9.

Aspect 15: A device comprising a processing system that includes one or more processors and one or more memories coupled with the one or more processors, the processing system configured to cause the device to perform the method of one or more of Aspects 1-9.

Aspect 16: An apparatus at a device, the apparatus comprising one or more memories and one or more processors coupled to the one or more memories, the one or more processors individually or collectively configured to cause the device to perform the method of one or more of Aspects 1-9.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:

receiving, by a glitch filter associated with a serial interface bus, an input signal associated with a glitch;

rejecting, by the glitch filter, the glitch based at least in part on a plurality of state machine transitions associated with the glitch filter and a set of timers associated with the glitch filter, wherein the set of timers includes a high timer and a low timer, and the input signal is locked at a high state for at least a length of the high timer and the input signal is locked at a low state for at least a length of the low timer, in accordance with the plurality of state machine transitions; and providing, by the glitch filter, an output signal based at least in part on the plurality of state machine transitions and the set of timers.

2. The method of claim 1, wherein the glitch filter is a synchronous finite state machine or an asynchronous finite state machine (AFSM) digital filter.

3. The method of claim 1, wherein the glitch filter is associated with one or more delay cells and a latch, wherein an input signal level is maintained for the one or more delay cells, and the latch prevents transitions of the input signal that are narrower than a programmable bandwidth setting.

4. The method of claim 1, wherein the input signal is received from an output driver associated with the serial interface bus, wherein the output driver includes one or more switchable resistors to match an output impedance associated with the output driver with a characteristic impedance of a transmission line associated with the serial interface bus, the output driver is associated with a programmable slew rate, and the output driver is associated with an automatic slew rate control to optimize a slew rate to match the characteristic impedance of the transmission line and minimize reflections and glitches on the serial interface bus.

5. The method of claim 1, wherein the glitch is a first glitch, and further comprising:

detecting, using a glitch detector associated with the serial interface bus, whether the output signal is associated with a second glitch, wherein the glitch detector is associated with a debugging of the glitch filter; and generating, at the glitch detector, an indication that the second glitch is associated with the output signal.

6. The method of claim 1, wherein the serial interface bus is associated with a power management integrated circuit (PMIC).

7. A non-transitory computer-readable medium storing a set of instructions for filtering glitches in a serial interface bus, the set of instructions comprising:

one or more instructions that, when executed by one or more processors of a device, cause the device to:

receive, by a glitch filter associated with a serial interface bus, an input signal associated with a glitch;

reject, by the glitch filter, the glitch based at least in part on a plurality of state machine transitions associated with the glitch filter and a set of timers associated with the glitch filter, wherein the set of timers includes a high timer and a low timer, and the input signal is locked at a high state for at least a length of the high timer and the input signal is locked at a low state for at least a length of the low timer, in accordance with the plurality of state machine transitions; and provide, by the glitch filter, an output signal based at least in part on the plurality of state machine transitions and the set of timers.

8. The non-transitory computer-readable medium of claim 7, wherein the glitch filter is a synchronous finite state machine or an asynchronous finite state machine (AFSM) digital filter.

9. The non-transitory computer-readable medium of claim 7, wherein the glitch filter is associated with one or more delay cells and a latch, and the latch prevents transitions of the input signal that are narrower than a programmable bandwidth setting.

10. The non-transitory computer-readable medium of claim 7, wherein the input signal is received from an output driver associated with the serial interface bus, wherein the output driver includes one or more switchable resistors to match an output impedance associated with the output driver with a characteristic impedance of a transmission line associated with the serial interface bus.

11. The non-transitory computer-readable medium of claim 10, wherein the output driver is associated with a programmable slew rate.

12. The non-transitory computer-readable medium of claim 10, wherein the output driver is associated with an automatic slew rate control to optimize a slew rate to match the characteristic impedance of the transmission line and minimize reflections and glitches on the serial interface bus.

13. The non-transitory computer-readable medium of claim 7, wherein the input signal is a clock signal or a data signal.

14. The non-transitory computer-readable medium of claim 7, wherein the serial interface bus is associated with a power management integrated circuit (PMIC).

15. The non-transitory computer-readable medium of claim 7, further comprising instructions that, when executed, cause the device to detect, using a glitch detector associated with the serial interface bus, whether the output signal is associated with a second glitch.

16. The non-transitory computer-readable medium of claim 15, further comprising instructions that, when executed, cause the device to generate, at the glitch detector, an indication that the second glitch is associated with the output signal.

17. An apparatus for filtering glitches in a serial interface bus, comprising:

means for receiving an input signal associated with a glitch by a glitch filter;

means for rejecting, by the glitch filter, the glitch based at least in part on a plurality of state machine transitions and a set of timers associated with the glitch filter, wherein the set of timers includes a high timer and a low timer, and the input signal is locked at a high state for at least a length of the high timer and the input signal is locked at a low state for at least a length of the low timer, in accordance with the plurality of state machine transitions; and means for providing, by the glitch filter, an output signal based at least in part on the plurality of state machine transitions and the set of timers.

18. The method of claim 1, wherein the glitch filter transitions an output state only in response to an input signal edge having a pulse width that is at least a threshold duration.

19. The method of claim 1, wherein each of the high timer and the low timer is programmable.

20. The apparatus of claim 17, wherein each of the high timer and the low timer is programmable.

* * * * *